United States Patent
Kim

(10) Patent No.: US 11,451,734 B2
(45) Date of Patent: Sep. 20, 2022

(54) IMAGE SENSOR FOR SUPPORTING PLURAL CAPTURING MODES

(71) Applicant: SK hynix Inc., Gyeonggi-do (KR)

(72) Inventor: Junghyun Kim, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 177 days.

(21) Appl. No.: 16/898,018

(22) Filed: Jun. 10, 2020

(65) Prior Publication Data

US 2021/0120199 A1    Apr. 22, 2021

(30) Foreign Application Priority Data

Oct. 22, 2019  (KR) .................... 10-2019-0131130

(51) Int. Cl.
| | | |
|---|---|---|
| *H04N 5/378* | (2011.01) | |
| *H04N 5/374* | (2011.01) | |
| *H01L 27/148* | (2006.01) | |
| *H01L 27/146* | (2006.01) | |

(52) U.S. Cl.
CPC ....... *H04N 5/378* (2013.01); *H01L 27/14627* (2013.01); *H01L 27/14643* (2013.01); *H01L 27/14812* (2013.01); *H04N 5/3741* (2013.01)

(58) Field of Classification Search
CPC .... H04N 5/378; H04N 5/3741; H04N 5/3696; H04N 5/369; H04N 5/343; H01L 27/14627; H01L 27/14643; H01L 27/14812; H01L 27/14612; H01L 27/14641; H01L 27/14605; H01L 27/14607; H01L 27/1463; H01L 27/14609
See application file for complete search history.

(56) References Cited

U.S. PATENT DOCUMENTS

| | | | |
|---|---|---|---|
| 6,455,831 B1 * | 9/2002 | Bandera ................. | G06V 10/20 250/208.6 |
| 8,493,482 B2 | 7/2013 | Cote et al. | |
| 8,896,735 B2 * | 11/2014 | Minagawa ............ | H04N 5/369 348/308 |
| 9,020,030 B2 | 4/2015 | Chen et al. | |
| 9,030,583 B2 * | 5/2015 | Gove ..................... | H04N 5/347 348/207.1 |
| 10,128,285 B2 | 11/2018 | Ooki et al. | |
| 10,235,912 B2 * | 3/2019 | Ahn ....................... | G06F 3/147 |
| 2011/0309462 A1 | 12/2011 | Sargent et al. | |
| 2013/0222546 A1 * | 8/2013 | Takahashi ......... | H01L 27/14623 348/46 |
| 2015/0304582 A1 * | 10/2015 | Hirota ................... | H04N 5/332 348/49 |
| 2018/0077339 A1 * | 3/2018 | Kameda ............. | H04N 5/23245 |
| 2019/0124277 A1 * | 4/2019 | Mabuchi ............... | H04N 5/341 |
| 2020/0322533 A1 * | 10/2020 | Kinoshita .......... | H04N 5/23293 |

* cited by examiner

*Primary Examiner* — Nhan T Tran
(74) *Attorney, Agent, or Firm* — IP & T Group LLP

(57) ABSTRACT

An image sensor includes a pixel array including a central region in which plural first pixels output first pixel information and a peripheral region in which plural second pixels output second pixel information, the peripheral region surrounding the central region. A size of a second pixel, of the plural second pixels, is 4n times greater than that of a first pixel, of the plural first pixels, n being an integer.

18 Claims, 10 Drawing Sheets

IMAGE SENSOR FOR SUPPORTING PLURAL CAPTURING MODES

CROSS-REFERENCE TO RELATED APPLICATION

This patent application claims to the benefit of Korean Patent Application No. 10-2019-0131130, filed on Oct. 22, 2019, the entire disclosure of which is incorporated herein by reference.

TECHNICAL FIELD

The disclosure relates to an image sensor, and more particularly, to an image sensor which differently operates according to plural shooting modes.

BACKGROUND

Various services and additional functions provided by an electronic device have been expanding. In order to increase utility and worth of an electronic device and satisfy various needs of users, various applications executable on the electronic device have been developed. Among these applications, there is a camera-related function. A user can use a camera mounted on the electronic device to take a picture of himself or a scene.

In response to various needs of users, an electronic device mounted camera is able to produce different types of images. In addition, multiple cameras may be mounted in an electronic device to produce one or more images as directed by the user. When the image sensor included in the camera supports various shooting modes, it is possible to provide more types of images to users and/or reduce the number of cameras mounted in the electronic device.

SUMMARY

An embodiment of disclosure may provide an image sensor and a method for operating the image sensor, which uses one size of pixels arranged in a central region and another, different size of pixels arranged in a peripheral region of the image sensor to change an operation mode of the central region based on a shooting mode of the camera device.

Further, an embodiment of disclosure may provide an image sensor and a method for operating the image sensor, which include a central region including plural pixels, each having a first size, and a peripheral region including plural pixels, each having a second size larger than the first size. In a first operation mode producing an image through the central region and the peripheral region, plural pixels in the central region may work as a single pixel. That is, pixel information outputted from a preset number of pixels in the central region may be combined or merged. In a second operation mode generating an image through the central region only, each pixel disposed in the central region may work individually.

In addition, an embodiment of disclosure may provide an image sensor and a method for operating the image sensor, which is capable of outputting pixel information corresponding to a size, a resolution or a color (monochrome or polychrome) of an image which is outputted from the camera. A working region of the image sensor may be different, or selectively determined, according to a shooting mode of the camera.

In an embodiment, an image sensor can include a pixel array including a central region in which plural first pixels output first pixel information and a peripheral region in which plural second pixels output second pixel information, the peripheral region surrounding the central region. A of a second pixel, of the plural second pixels, is 4n times greater than that of a first pixel, of the plural first pixels. The n is an integer.

By the way of example but not limitation, the first pixel can include a single photodiode and a single lens over the single photo diode. The second pixel can include plural photo diodes and a single lens over the plural photo diodes.

The first pixel can include plural transfer gates, each configured to couple a respective one of the plural photodiodes to a floating diffusion area; plural reset gates configured to reset the floating diffusion area; and plural select gates, each configured to be turned on in response to an amount of charge accumulated in the floating diffusion area. Only one of the plural select gates can be turned on.

The first pixel and the second pixel individually can include a single photodiode and a single lens over the single photo diode.

The first pixel information is transferred via a single column line coupling the first pixel of the pixel array to signal output circuitry. The second pixel information is transferred via one of plural column lines each coupling the second pixel of the pixel array to the signal output circuitry.

In another embodiment, an image sensor can include a pixel array including a central region in which plural first pixels each output first pixel information and a peripheral region in which plural second pixels each output second pixel information, the peripheral region surrounding the central region; and signal output circuitry configured to combine first pixel information, individually outputted from each pixel in a set of adjacent pixels, among the plural pixel pixels, to generate third pixel information for output in a first operation mode.

The signal output circuitry can be configured to output the first pixel information outputted from the plural first pixels of the central region in a second operation mode which is distinguishable from the first operation mode, and to screen the second pixel information outputted from the plural second pixels of the peripheral region in the second operation mode.

The number of pixels in the set of adjacent pixels which output first pixel information that is combined by the signal output circuitry is determined based on a ratio of a flat size of the first pixel to a flat size of the second pixel.

The flat size of the first pixel is ¼n times of the flat size of the second pixel. The n is an integer of 1 or greater.

The signal output circuitry can be configured to receive an operation mode signal and a row address of the pixel array; and, determine, based on the operation mode signal and the row address, which of the first and second pixels pixel information is transferred via a column line when the column line crosses the first and second regions.

In another embodiment, an image sensor can include a pixel array including a first region including plural first pixels, each having a first planar area, and a second region including plural second pixels, each having a second planar area; and signal output circuitry configured, based on an operation mode, to output one of first pixel information individually outputted from the plural first pixels and third pixel information obtained from the plural first pixels. The first pixel information can correspond to the first planar area. The signal output circuitry can be configured to generate the third pixel information by combining first pixel information from a set of first pixels among the plural first pixels. The third pixel information can correspond to the second planar area.

The signal output circuitry can be configured, in a first operation mode, to output the third pixel information. The signal output circuitry can be configured, in the first operation mode, to output second pixel information obtained from the plural second pixels in the second region.

The signal output circuitry can be configured, in a second operation mode, to output the first pixel information. The signal output circuitry can be configured, in the second operation mode, to screen the second pixel information.

The first pixel information can be transferred via a single column line coupling the first pixel of the pixel array to the signal output circuitry. The second pixel information can be transferred via one of plural column lines each coupling the second pixel of the pixel array to the signal output circuitry.

The pixel array can further include a third region including plural third pixels, each having a third planar area. The signal output circuitry can be configured, based on the operation mode, to output one among the first pixel information, the third pixel information and fifth pixel information obtained from the plural first pixels. The signal output circuitry can be configured to generate the fifth pixel information by combining some of the first pixel information. The fifth pixel information can correspond to the third planar area. The signal output circuitry can be further configured, based on the operation mode, to output one of second pixel information individually outputted from the plural second pixels and fourth pixel information respectively obtained from the plural second pixels. The signal output circuitry can be configured to generate the fourth pixel information by combining some of the second pixel information. The fourth pixel information can correspond to the third planar area.

The third planar area can be larger than the second planar area, and the second planar area is larger than the first planar area.

The signal output circuitry can be configured, in a first operation mode, to output the fifth pixel information and the fourth pixel information. The signal output circuitry can be configured, in the first operation mode, to output sixth pixel information obtained from the plural third pixels in the third region.

The signal output circuitry can be configured, in a second operation mode, to output the third pixel information and the second pixel information. The signal output circuitry can be configured, in the second operation mode, to screen sixth pixel information obtained from the plural third pixels in the third region.

The signal output circuitry can be configured, in a third operation mode, to output the first pixel information. The signal output circuitry can be configured, in the third operation mode, to output to screen both the second pixel information and sixth pixel information obtained from the plural third pixels in the third region.

The signal output circuitry is configured to: receive an operation mode signal and a row address of the pixel array; determine, based on the operation mode signal and the row address, which of the first to third pixels pixel information is transferred via a column line when the column line crosses the first to third regions; and determine, based on the operation mode signal and the row address, which of the second and third pixels pixel information is transferred via another column line when the another column line crosses the second and third regions.

In another embodiment, an image sensor can include a pixel array including: plural central pixels disposed in a central region of the pixel array, and plural surrounding pixels disposed in a surrounding region surrounding the central region, each of the surrounding pixels having a size 4 times greater than a size of a single central pixel; and signal output circuitry configured to: output first and second central pixel information according to a central mode and a full mode, respectively, and output surrounding pixel information according to the full mode. The first central pixel information can be from a single central pixel. The second central pixel information can be from 4 central pixels corresponding to a single surrounding pixel. The surrounding pixel information can be from a single surrounding pixel.

In another embodiment, an image sensor can include a pixel array including: plural central pixels disposed in a central region of the pixel array, plural intermediate-surrounding pixels disposed in an intermediate-surrounding region surrounding the central region, each of the plural intermediate-surrounding pixels having a size 4 times greater than a size of a single central pixel, and plural full-surrounding pixels disposed in a full-surrounding region surrounding the intermediate-surrounding region, each of the plural full-surrounding pixels having a size 4 times greater than a size of a single intermediate-surrounding pixel; and a signal output circuitry configured to: output first to third central pixel information according to a central mode, an intermediate mode and a full mode, respectively, and output first and second intermediate-surrounding pixel information according to the intermediate mode and the full mode, respectively, and output full-surrounding pixel information according to the full mode. The first central pixel information can be from a single central pixel. The second central pixel information can be from 4 central pixels corresponding to a single intermediate-surrounding pixel. The third central pixel information can from 16 central pixels corresponding to a single full-surrounding pixel. The first intermediate-surrounding pixel information can be from a single intermediate-surrounding pixel. The second intermediate-surrounding pixel information can be from 4 intermediate-surrounding pixels corresponding to a single full-surrounding pixel. The full-surrounding pixel information can be from a single surrounding pixel.

BRIEF DESCRIPTION OF THE DRAWINGS

The description herein makes reference to the accompanying drawings wherein like reference numerals refer to like parts throughout the figures.

Figure 1:
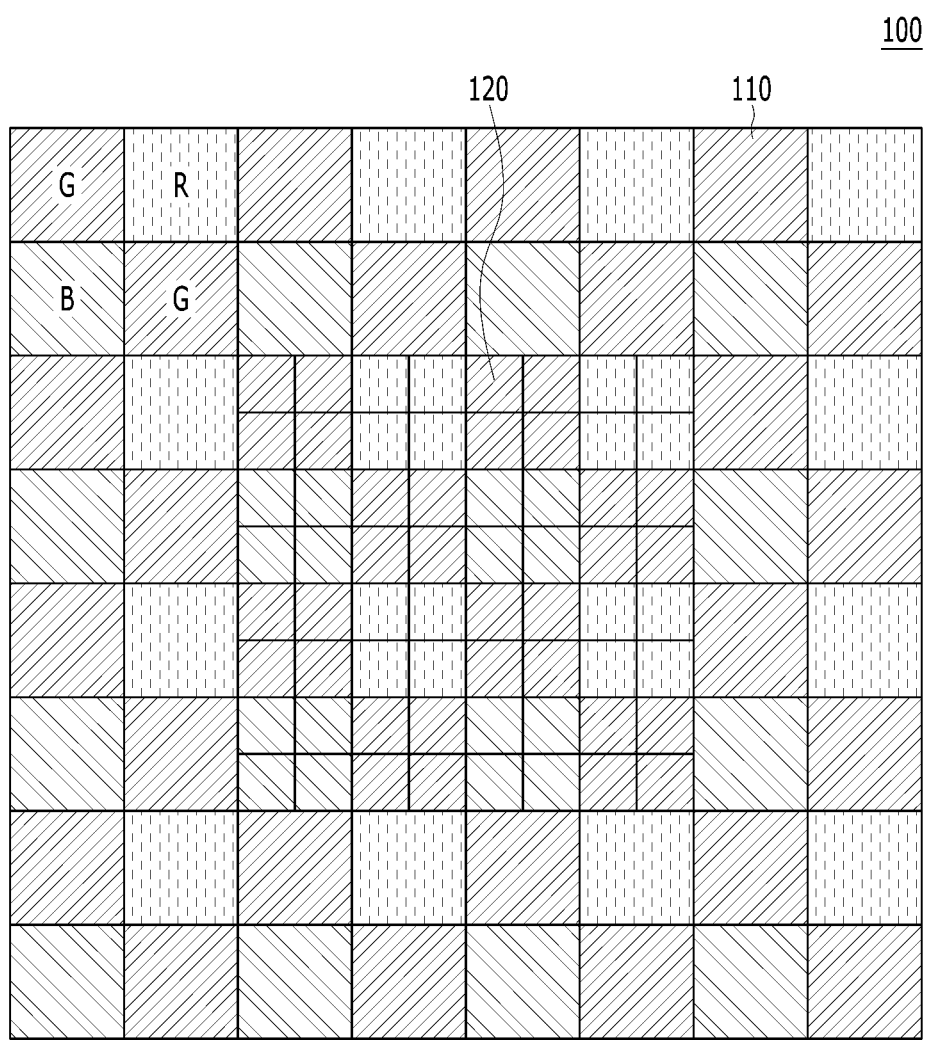
FIG. 1 illustrates an image sensor according to an embodiment of the disclosure.

Throughout the specification, reference to "an embodiment," "another embodiment" or the like do not necessarily refer to the same embodiment, and different references to any such phrase are not necessarily to the same embodiment(s). Particular features, structures, or characteristics may be combined in any suitable manner consistent with this disclosure.

DETAILED DESCRIPTION

Various embodiments of the disclosure are described below in with reference to the accompanying drawings. Elements and features of the disclosure, however, may be configured or arranged differently to form other embodiments, which may be variations of any of the disclosed embodiments.

In this disclosure, the terms "comprise," "comprising," "include" and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

As used herein, terms used as labels for nouns that they precede do not imply any type of ordering (e.g., spatial, temporal, logical, etc.). For example, the terms "first" and "second" used in the context of values do not necessarily imply that the first value must be written or appear before the second value. Further, although the terms "first", "second", "third", and so on may be used to identify various elements, these elements are not limited by these terms. These terms are used to distinguish one element from another element that otherwise have the same or similar names. For example, first circuitry may be distinguished from second circuitry.

Further, the term "based on" is used to describe one or more factors that affect a determination. This term does not foreclose that there may be additional factors that affect a determination. That is, a determination may be solely based on the stated factor(s) or based, at least in part, on such factor(s). Consider the phrase "determine A based on B." While in this case, B is a factor that affects the determination of A, such a phrase does not foreclose that the determination of A is also being based on C. In other instances, A may be determined based solely on B.

As used in the disclosure, the term 'circuitry' refers to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

Embodiments of the disclosure are described below with reference to the accompanying drawings, wherein like numbers reference like elements.

FIG. 1 describes an image sensor according to an embodiment of the disclosure.

Referring to FIG. 1, an image sensor 100 may include a pixel array. In the pixel array, plural pixels 110, 120 having different sizes (e.g., planar areas) are arranged in plural rows and plural columns. Here, each of the plural pixels 110, 120 may include at least one photodiode. Each of the pixels 110, 120 can be considered a unit or a component capable of outputting electrical information corresponding to incident light.

A central region of the pixel array in the image sensor 100 may include a plurality of first pixels 120, each having a small planar area. A peripheral region may include a plurality of second pixels 110, each having a larger planar area than the first pixel 120. In the pixel array shown in FIG. 1, four first pixels 120 may have substantially the same planar area as a single second pixel 110. That is, the planar area of a first pixel 120 may be ¼ that of a second pixel 110. According to another embodiment, the planar area of a first pixel 120 may be ¹⁄₁₆ the planar area of a second pixel 110. The respective planar areas of the first and second pixels 120, 110 may be differently designed and fabricated according to a specification of the image sensor 110. In general, the planar area of the first pixel 120 is smaller than the planar area of the second pixel 110.

For example, the image sensor 100 may obtain a color image in a visible light spectrum through the plurality of first pixels 120 and the plurality of second pixels 110. Each pixel may include a red (R), green (G) or blue (B) color filter. Red, green and blue are known as three primary colors of light (color image). In FIG. 1, the plurality of first pixels 120 and the plurality of second pixels 110 may be arranged to form a Bayer pattern. In the Bayer pattern, pixels including the green (G) filter may be 50% of the total, pixels including the red (R) filter and pixels including the blue (B) filter are 25% individually. The second pixel 110 disposed in the peripheral area may output pixel information corresponding to one color filter. On the other hand, four first pixels 120 adjacently disposed in the central region may individually output pixel information corresponding to one color filter, i.e., the same color filter.

According to an embodiment, the first pixels 120 disposed in the central region may operate in two different operation modes. For example, in a first mode of the two operation modes, the image sensor 100 may collect a low-resolution color image for a large scene. But, in a second mode of the two operation modes, the image sensor 100 may collect a high-resolution color image for a small scene. Specifically, in the first mode, a color image may be obtained based on pixel information outputted from the plurality of first pixels 120 in the central region and the plurality of second pixels 110 disposed in the peripheral region. In the second mode, a color image may be acquired based on pixel information outputted from the plurality of first pixels 120 disposed in the central region only. In the second mode, the plurality of second pixels 110 disposed in the peripheral area may not be used to generate a color image. A user of the camera device equipped with the image sensor 100 may obtain a color image for a scene in the first mode, and then obtain a clearer image for a specific area (or target area) in the scene through the second mode. Further, when a plurality of camera devices each having an image sensor 100 are used, each image sensor 100 may output pixel information according to an operation mode set on its respective camera.

Figure 2:
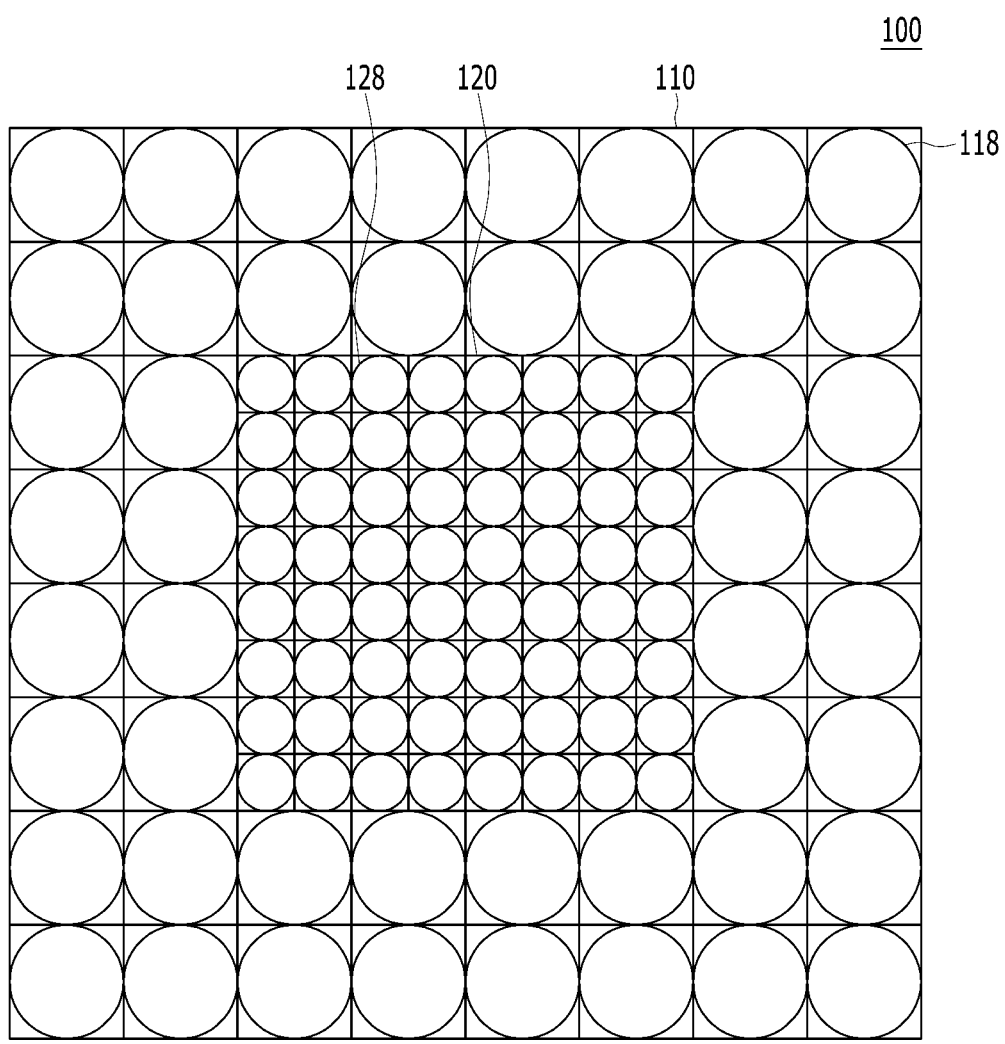
FIG. 2 shows a first structure of an image sensor, such as that illustrated in FIG. 1.

FIG. 2 shows a first structure of the image sensor illustrated in FIG. 1.

Referring to FIG. 2, sizes of lenses 128, 118 may correspond to sizes (planar areas) of the first and second pixels 120, 110 disposed in the center region and the peripheral region of the image sensor 100, individually. The size of lens 128 is different from that of lens 118. The lenses 128, 118 disposed over the pixels may be used to increase a light reception rate of the image sensor 100, i.e., the lenses 128, 118 may make more incident light reach the pixels. The lenses 128, 118 may improve performance or quality related to sensitivity and noise. The lenses 128, 118 may be very small in size and each such lens is generally called a micro-lens. The lenses 128, 118 may be arranged in an array, corresponding to the plurality of pixels 120, 110 arranged along rows and columns in the image sensor 100. Further, the lenses 128, 118 may reduce a light-receiving area of the photo diode included in each pixel, so as to secure a design margin for other components in the image sensor 110, e.g., to reduce difficulty in designing or arranging transistors or circuits included in the image sensor 100.

The size of the first micro lens 128 and the size of the second micro lens 118 may be determined individually based on the sizes of the first pixel 120 and the second pixel 110. Referring to FIG. 2, the size of the first micro lens 128 disposed on the first pixel 120 may be smaller than the size of the second micro lens 118 disposed on the second pixel 110. For example, when the first pixel 120 is ¼ the size of the second pixel 110, the first micro lens 128 may be about 4 times smaller than the second micro lens 118.

Figure 3:
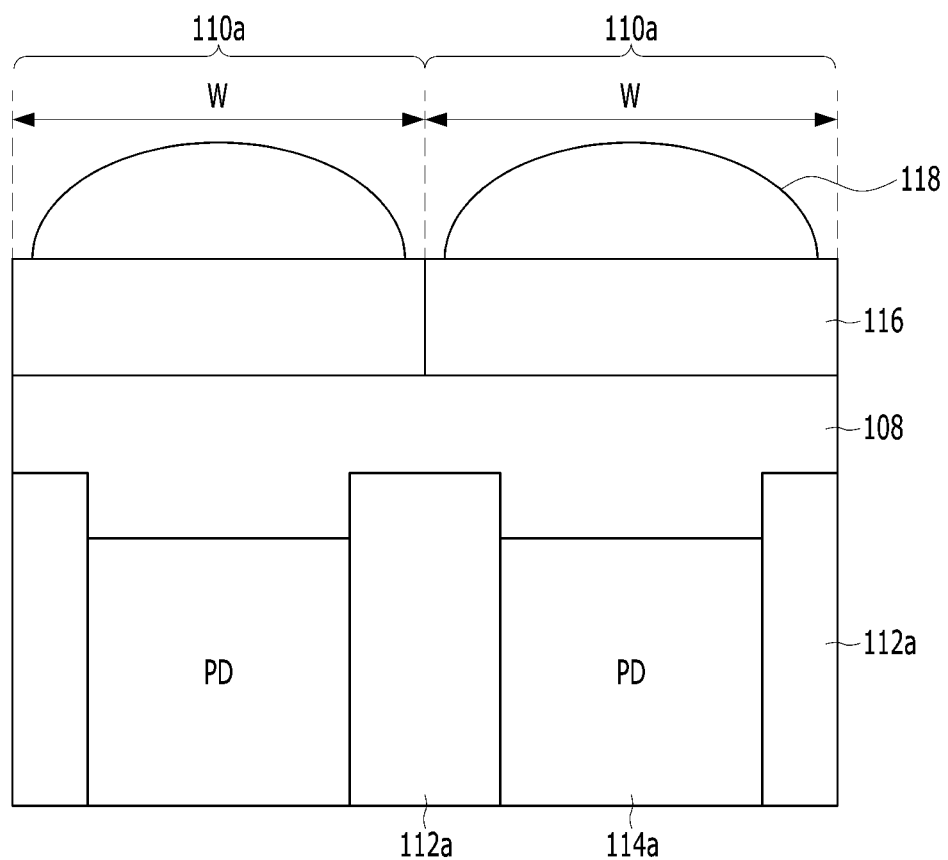
FIG. 3 illustrates a first example of pixels arranged in a peripheral area of an image sensor, such as that illustrated in FIG. 1.

FIG. 3 illustrates a first example of pixels arranged in a peripheral area of the image sensor described in FIG. 1. Specifically, FIG. 3 shows an example of the second pixel 110 arranged in the peripheral region shown in FIG. 1.

Referring to FIG. 3, a second pixel 110a in the image sensor has a set first width W. A device isolation structure 112a formed in the substrate may separate a photo diode (PD) 114a included in the second pixel 110a from another photo diode included in adjacent second pixel.

Although not shown, according to an embodiment, the photo diode (PD) 114a may include a plurality of photo-electric conversion layers that overlap vertically. For example, the photo diode 114a may include a first layer including an N-type impurity region and a second layer including a P-type impurity region. In FIG. 3, there is no gap between the photo diode (PD) 114a and the device isolation structure 112a. However, according to another embodiment, the photo diode (PD) 114a and the device isolation structure 112a may be spaced apart a set distance. Moreover, while FIG. 3 shows that a top surface of the photo diode (PD) 114a is even, in another embodiment the photo diode (PD) 114a may have a protruding surface. When a top surface of the photo diode (PD) 114a has a protruding surface (or concavo-convex surface), more incident light may be collected compared to a PD 114a with an even top surface. Thus, an uneven top surface may improve sensitivity of the image sensor.

A height of the device isolation structure 112a is higher than that of the photo diode (PD) 114a formed on the substrate. After a planarization film 108 is formed over the device isolation structure 112a and the photo diode (PD) 114a to give the entire structure a uniform height, a color filter 116 can be disposed on the planarization film 108. Referring to FIGS. 1 and 3, a different color filter 116 (R, B or G) may be disposed on different second pixels 110a.

The lens 118 may be disposed on the color filter 116. Referring to FIGS. 2 and 3, the lens 118 may have a size (e.g., a diameter) corresponding to the size (planar area) of the second pixel 110a.

Figure 4:
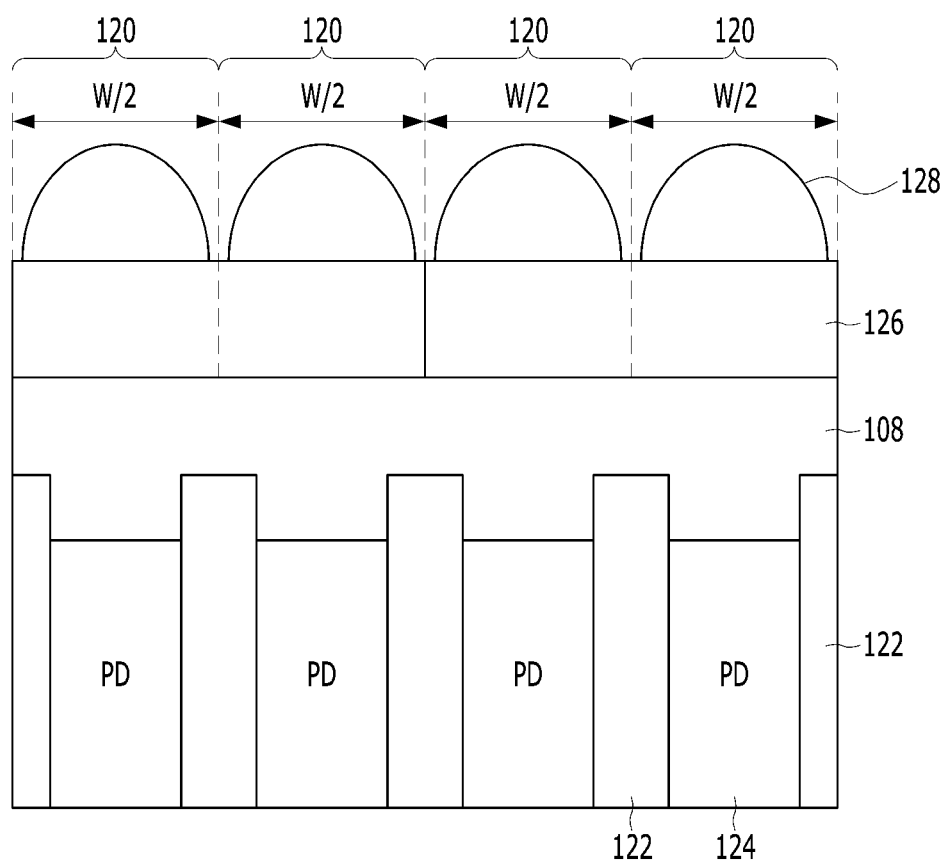
FIG. 4 illustrates an example of pixels arranged in a central region of an image sensor, such as that illustrated in FIG. 1.

FIG. 4 illustrates an example of pixels arranged in a central region of the image sensor described in FIG. 1. Specifically, FIG. 4 shows an example of the first pixel 120 arranged in the central region shown in FIG. 1.

Referring to FIGS. 1 to 4, the first pixel 120 in the image sensor has a set second width W/2. Thus, when the second pixel 110a described in FIG. 3 has the first width W, the width of the first pixel 120 is half that of the second pixel 110a, when the first pixel 120 is a quarter the size of the second pixel as described in FIGS. 1 and 2. Each of the first pixels 120 may be separated by the device isolation structure 122. The device isolation structure 122 formed on or in the substrate may separate a photo diode (PD) 124 included in the second pixel 120 from another photo diode (PD).

According to an embodiment, the photo diode (PD) 124 may include a plurality of photoelectric conversion layers that overlap vertically. For example, the photo diode (PD) 124 may include a first layer including an N-type impurity region and a second layer including a P-type impurity region. FIG. 4 show that the photo diode (PD) 124 and the device isolation structure 122 may be coupled to each other. In another example, the photo diode (PD) 124 and the device isolation structure 122 may be spaced apart with a set gap in between. Further, FIG. 4 shows an example of the photo diode (PD) 124 having an even top surface. In another example, the photo diode (PD) 124 may have a protruding top surface or an uneven top surface. When a top surface of the photo diode (PD) 124 is concavo-convex, it is possible to collect more incident light than with a PD having an even top surface, thereby improving sensitivity of the image sensor.

A height of the device isolation structure 122 is higher than that of the photo diode (PD) 124 formed on the substrate. On or over the photo diode (PD) 124 and the device isolation structure 122, the planarization film 108 is formed to flatten the heights of the photo diode (PD) 124 and the device isolation structure 122. The color filter 126 can be disposed on the planarization film 108. Referring to FIGS. 1, 2 and 4, the color filter 116 for every two adjacent second pixels 120 may include a filter of the same color.

The lens 118 may be formed on the color filter 116. Referring to FIGS. 2 and 4, the lens 128 may have a diameter corresponding to the size (planar area) of the second pixel 120. Referring to FIGS. 3 and 4, the size of the lens 128 included in the second pixel 120 may be smaller than the size of the lens 118 included in the first pixel 110.

Figure 5:
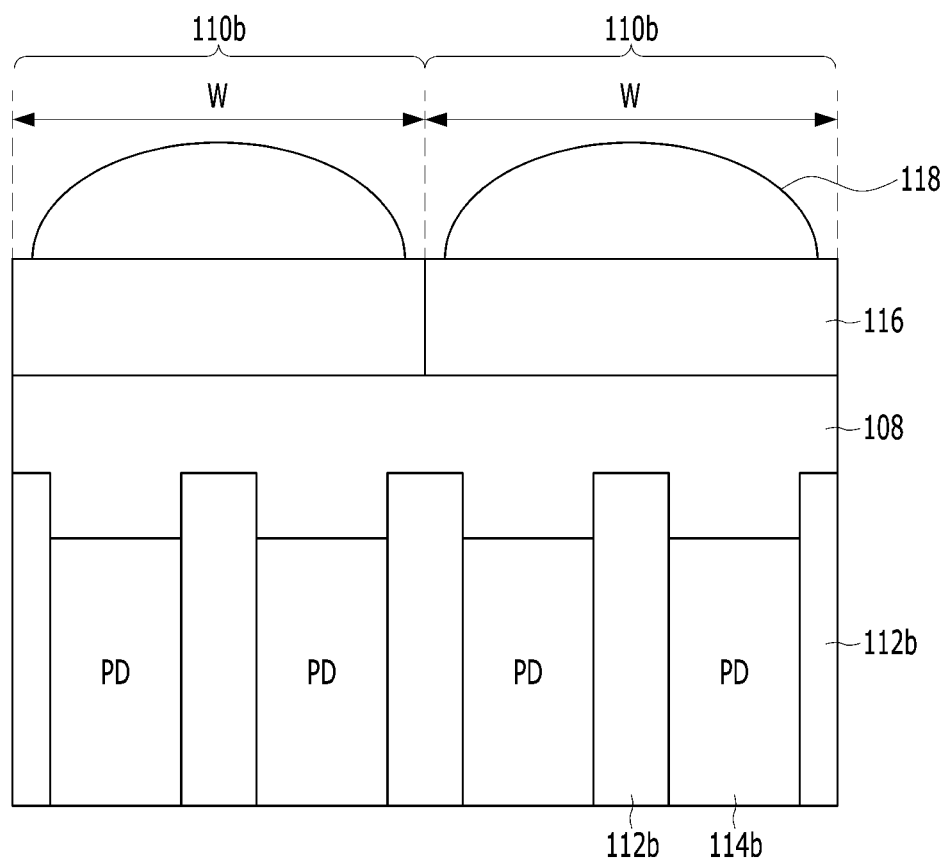
FIG. 5 illustrates a second example of pixels arranged in the peripheral area of an image sensor, such as that illustrated in FIG. 1.

FIG. 5 illustrates a second example of pixels arranged in the peripheral area of the image sensor described in FIG. 1. Specifically, FIG. 5 shows another example of the second pixel 110 arranged in the peripheral region shown in FIG. 1.

Referring to FIG. 5, it is assumed that the second pixel 110b in the image sensor has the same width (i.e., the first width W) with the second pixel 110a described in FIG. 3. The second pixel 110b may be separated by the device isolation structure 112b. But, the second pixel 110b may include two photo diodes (PD) 114b, which is different from that shown in FIG. 3. The device isolation structure 112b formed on or in the substrate may separate a photo diode (PD) 114b from the other photo diode (PD) included in the second pixel 110b.

Referring to FIGS. 1 and 2, the first pixel 120 and the second pixel 110 may have different sizes (e.g., different planar areas). According to an embodiment, as described in FIGS. 3 and 4, the photo diodes individually included in the first pixel 120 and the second pixel 110 may have different sizes. When the first pixel 120 and the second pixel 110 are designed to have different sizes of the photo diode (PD) and the device isolation structure 112b formed on the substrate, difficulties may occur in the manufacturing process. On the other hand, referring to FIGS. 4 and 5, the photo diodes (PD) 124, 114b and the device isolation structure 122, 112b individually included in the first pixel 120 and the second pixel 110b may have substantially same size. The sizes of the color filters 116, 126 included in the first pixel 120 and the second pixel 110b may be substantially identical. However, only sizes of the lenses 118, 128 individually included in the first pixel 120 and the second pixel 110b may be different.

According to an embodiment, the photo diode (PD) 114b may include a plurality of photoelectric conversion layers which vertically overlap. Each of the photoelectric conversion layers may include one of an N-type impurity region and a P-type impurity region. The photo diode (PD) 114b and the device isolation structure 112b may be spaced apart from each other. According to an embodiment, like an example shown in FIG. 3, a top surface of the photo diode (PD) 114b may be even or flat. According to another embodiment, the top surface of the photo diode (PD) 114b may have a protruding surface (e.g., the top surface may be uneven). When the top surface of the photo diode (PD) 114b has a protruding portion or a concavo-convex portion, more incident light can be collected more than with a photo diode having a flat top surface, so that performance and sensitivity of the image sensor can be improved.

The device isolation structure 112b is a higher height than the photo diode (PD) 114b formed on the substrate. Over the photo diode (PD) 114b and the device isolation structure 112b, the planarization film 108 may be formed to flatten upper portions of the photo diode (PD) 114b and the device isolation structure 112b. On the flat upper portions, i.e., the planarization film 108, the color filter 116 can be disposed. Referring to FIGS. 1 and 3, the color filter 116 for each second pixel 110b may include a filter of different colors. The color filter 116 may be a means for increasing selectivity for a specific color such as Red (R), Green (G) or Blue (B) band (e.g., wavelength) in a visible light spectrum. Here, the selectivity may mean a degree or a level regarding an amount of received light related to a specific color, which may indicate how the image sensor may read the specific color accurately. According to an embodiment, when the image sensor 100 is designed to output pixel information corresponding to monochrome, the same color filter 116 is disposed over all pixels, or there is no color filter over any of the pixels. For example, when the image sensor 100 is used for obtaining a distance between a camera device and a target such as a time-of-flight (TOF) sensing system, the image sensor 100 may output pixel information for a monochrome image.

According to an embodiment, the lens 118 may be disposed on the color filter 116. Referring to FIGS. 2 to 3, the lens 118 may have a size (e.g., a diameter) corresponding to the size (e.g., planar area) of the second pixel 110a. The lens 118 may have a hemispherical shape, but the height and width of the lens 118 may be adjusted according to an embodiment. The higher the height of the lens relative to a width of the lens, the more incident light accumulated in a pixel under the lens. According to an embodiment, the height of the lens 118 over pixels disposed in the peripheral region may be higher than that of the lens 128 over pixels arranged in the central region.

As described above, when elements or components included in the first pixel 120 disposed in the central region and the second pixel 110b disposed in the peripheral region are manufactured to have a substantially same size, such construction may improve the margin of the manufacturing process of the image sensor so that efficiency in the manufacturing process can be increased.

Figure 6:
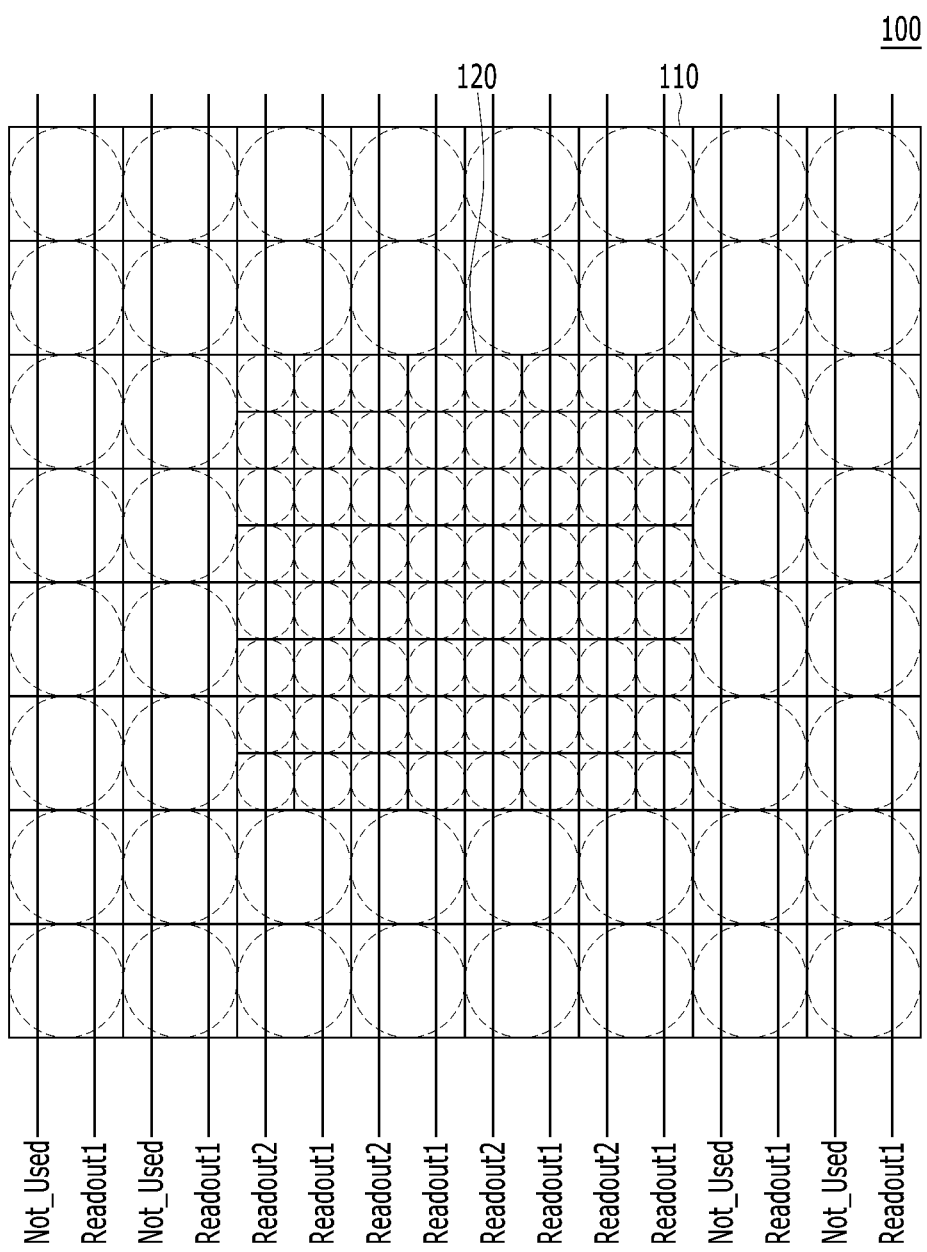
FIG. 6 shows a second structure of an image sensor, such as that illustrated in FIG. 1.

FIG. 6 shows a second structure of the image sensor illustrated in FIG. 1.

Referring to FIG. 6, the image sensor 100 may include plural column lines for transferring pixel information outputted from the plurality of first pixels 120 and the plurality of second pixels 110.

In an image sensor, a pixel is coupled to a single column line for transferring pixel information. However, according to an embodiment of the disclosure, some pixels are coupled to plural column lines because sizes of pixels in the image sensor are different. Referring to FIG. 6, because the size of each first pixel 120 is different from that of each second pixel 110 included in the image sensor 100 and each first pixel 120 operates individually according to an operation mode, plural column lines may be coupled to a pixel arranged in the peripheral region of the pixel array.

The size of the first pixel 120 disposed in the central region of the pixel array included in the image sensor 110 may be smaller than the size of the second pixel 110 disposed in the peripheral region. At least one column line should be coupled to each first pixel 120 for transferring pixel information outputted from each first pixel 120 when each of the first pixels 120 operates individually. However, due to the peripheral region surrounding the central region, plural column lines may be connected to each of the second pixels 110 even though each of the plural column lines is connected to each of the first pixels 120. Referring to FIG. 6, because the first pixel 120 is ¼ the size of the second pixel 110, some of the second pixels 110 can be coupled to two column lines even though each of the first pixels 120 is coupled to each of the two column lines. On the other hand, the pixel array may also have a column line coupled to some of the second pixels 110 in the peripheral region, not the first pixel 120 in the central region. In this case, according to an embodiment, a single column line crossing the peripheral region only, not the central region, may be formed. However, for improving efficiency in a manufacturing process, plural column lines, each having the same size and being spaced apart at a regular gap, may be arranged in the pixel array.

Referring to FIG. 6, a first column line Readout1 may be used for transferring pixel information outputted from the second pixel 110 in the peripheral region only, not the central region, regardless of the operation mode. But, the other column line Not_Used may not be used. On the other hand, a column line coupled to the first pixel 120 disposed in the central region may be used regardless of the operation mode. That is, all column lines Readout1, Readout1 crossing the central region may be used.

Two column lines are connected to each of the second pixels 110 disposed in the peripheral region. Regardless of the operation mode, the second pixel 110 may output pixel information through one of the two column lines. Some of column lines may be coupled to both the second pixel 110 disposed in the peripheral region and the first pixel 120 disposed in the central region. In an operation mode, pixel information of may be outputted from pixels corresponding to all row addresses through the column line. But, in another operation mode, pixel information may be outputted through the column line at some of row addresses corresponding to the central region only.

Figure 7:
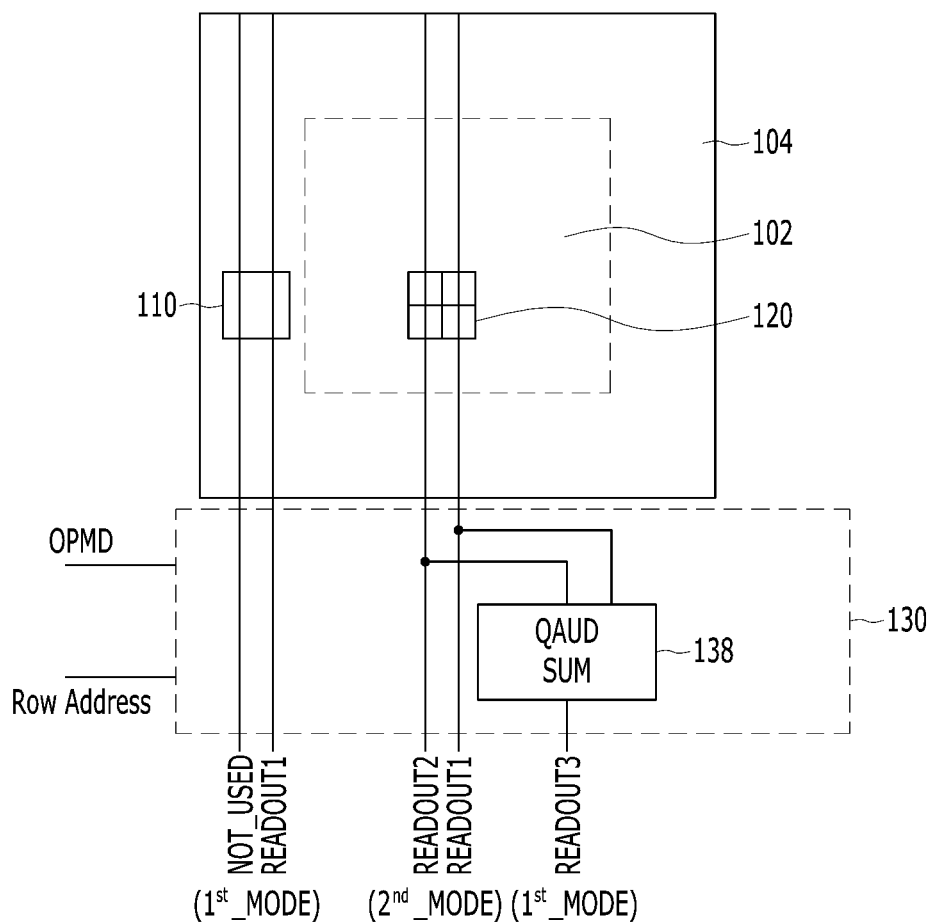
FIG. 7 shows a third structure of an image sensor, such as that illustrated in FIG. 1.

FIG. 7 shows a third structure of the image sensor illustrated in FIG. 1.

Referring to FIG. 7, a pixel array in the image sensor 100 may include a central region 102 and a peripheral region 104. A plurality of first pixels 120 may be disposed in the central region 102, and a plurality of second pixels 110 may be disposed in the peripheral region. In the illustrated embodiment, each of the second pixels 110 is four times the size of each of the first pixels 120. The first pixel 120 and the second pixel 110 included in the pixel array in the image sensor 100 may individually output pixel information to signal output circuitry 130 through a plurality of column lines.

Depending on an operation mode, the signal output circuitry 130 may individually output pixel information transmitted from the plurality of first pixels 120 disposed in the central area 102. In response to another operation mode, the signal output circuitry 130 may combine, or merge, pixel information outputted from a set of adjacent pixels among the plurality of first pixels 120 arranged in the central area 102. Specifically, the signal output circuitry 130 may receive an operation mode signal OPMD and a row address of the pixel array. In a first operation mode $1^{st}$_MODE, the signal output circuitry 130 may output pixel information transferred through the column line READOUT1 connected to the second pixels 110 disposed in the peripheral region. But, in a second operation mode $2^{nd}$_MODE, the signal output circuitry 130 might not output pixel information transferred through the column line READOUT1 coupled to the second pixels 110 in the peripheral region.

In addition, in the first operation mode $1^{st}$_MODE, the signal output circuitry 130 may differently process pixel information transferred through the column lines READOUT1 and READOUT2, coupled to the first pixels 120 and the second pixels 110, according to a row address related to the pixel information. When it is determined that the pixel information is outputted from the second pixel 110 based on the row address, the signal output circuitry 130 may output the pixel information as is. For example, in the second operation mode $2^{nd}$_MODE, the signal output circuitry 130 may output pixel information individually transmitted through the column lines READOUT1, READOUT2 without merge or combination. However, when it is determined that the pixel information is outputted from the first pixel 120 based on the row address, quad sum circuitry 138 in the signal output circuitry 130 may combine or merge pixel information of multiple, e.g., four, adjacent pixels. In the first operation mode, the quad sum circuitry 138 may work, to generate or output a quad sum value of the pixel array. The quad sum circuitry 138 may generate pixel information by combining pixel information outputted from four first pixels 120 adjacently located to each other (in adjacent rows and columns). Then, the quad sum circuitry 138 may output the merged or combined pixel information through another column line READOUT3.

Pixel information outputted from the signal output circuitry 130 according to an operation mode may correspond to Bayer pattern data. Although not shown, the image sensor 100 further includes interpolation circuitry configured to interpolate color values of surrounding pixels to a pixel, based on pixel information outputted from the signal output circuitry 130, to determine a color for the pixel. For example, the interpolation circuitry may perform a demosaicking operation based on at least one algorithm such as a pixel doubling interpolation applying the value of a nearest pixel having a green (G) filter to two target pixels, a nearest neighbor pixel interpolation copying the value of the nearest pixel to a target pixel, or a bilinear interpolation multiplying weights to the nearest pixels in the vicinity to assign a multiplied value to a target pixel.

Figure 8:
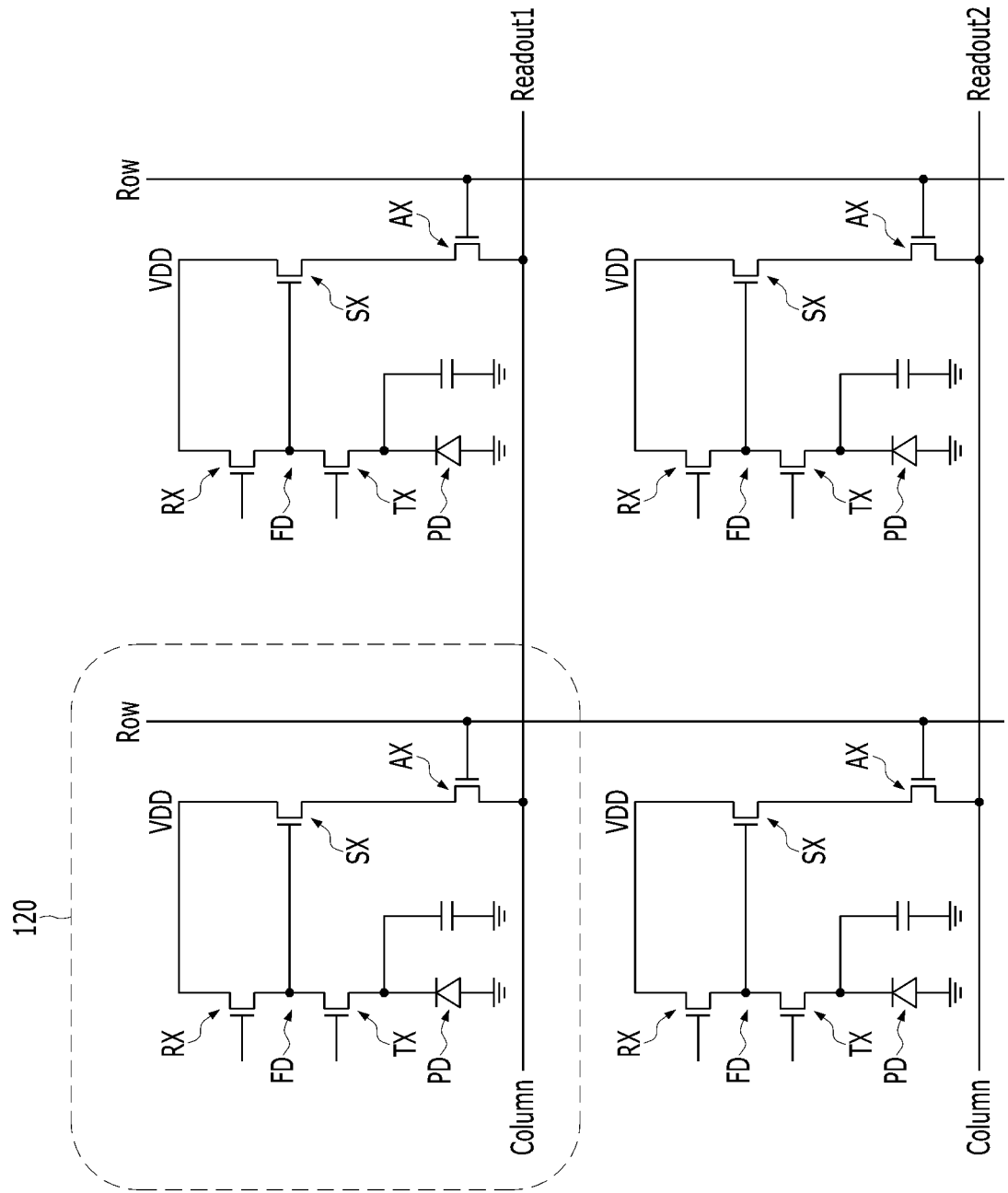
FIG. 8 illustrates a configuration of a pixel, such as that illustrated in FIG. 4.

FIG. 8 illustrates a configuration of the pixel described in FIG. 4. Specifically, FIG. 8 describes an example of the first pixel 120 arranged in the central region of the pixel array included in the image sensor 100.

Referring to FIG. 8, a plurality of first pixels 120 in a pixel array may be arranged in rows and columns. Each of the first pixels 120 may be coupled to both a row line that is activated in response to a row address and a column line that transfers pixel information to a signal output circuitry 130.

According to an embodiment, the first pixel 120 may include a photo diode PD, a transfer transistor Tx, a selection transistor Sx, a reset transistor Rx and an access transistor Ax. Herein, the transfer transistor Tx, the selection transistor Sx, the reset transistor Rx and the access transistor Ax may be referred to as a transfer gate, a selection gate, a reset gate and an access gate, individually. The photo diode PD may include a plurality of photoelectric conversion layers that vertically overlap with each other. Each of the photoelectric conversion layers of a photo diode may include an N-type impurity region or a P-type impurity region. A gate of the transfer transistor (Tx) may extend into the substrate. For example, the transfer gate may have a shape of a recess gate, a saddle-fin gate, or a buried gate. A drain of the transfer transistor Tx may be understood as a floating diffusion region FD. The floating diffusion region FD may be a source of the reset transistor Rx. The floating diffusion region FD may be electrically connected to a gate of the selection transistor Sx. The selection transistor Sx and the reset transistor Rx may be connected in series. The selection transistor Sx is coupled to the access transistor (Ax). When the reset transistor Rx, the selection transistor Sx and the access transistor Ax can be shared among neighboring pixels, a degree of integration can be improved.

An image sensor described herein may operate according to an embodiment as follows. First, while the incident light is blocked, the power supply voltage VDD is applied to the drain of the reset transistor Rx and the drain of the selection transistor Sx to discharge an amount of charges remaining in the floating diffusion region FD. Then, when the reset transistor Rx is turned off and the incident light from the outside is inputted on the photo diode PD, the photo diode PD may generate an electron-hole pair, an amount of charge in response to the incident light. The generated holes may move to the P-type impurity region, and the generated electrons may move to the N-type impurity region so that the generated electrons may be accumulated. When the transfer transistor Tx is turned on, an amount of charge such as accumulated electrons and holes can be transferred to the floating diffusion region FD so that the amount of charge may be accumulated. The gate bias of the selection transistor Sx can be changed in proportion to the accumulated amount of charge, resulting in a change in the source potential of the selection transistor Sx. At this time, when the access transistor Ax is turned on, a signal such as pixel information determined based on the amount of charge can be transferred (or read) in a column line. Through this procedure, the first pixel 120 described in FIG. 8 may operate individually to output pixel information via a column line.

Figure 9:
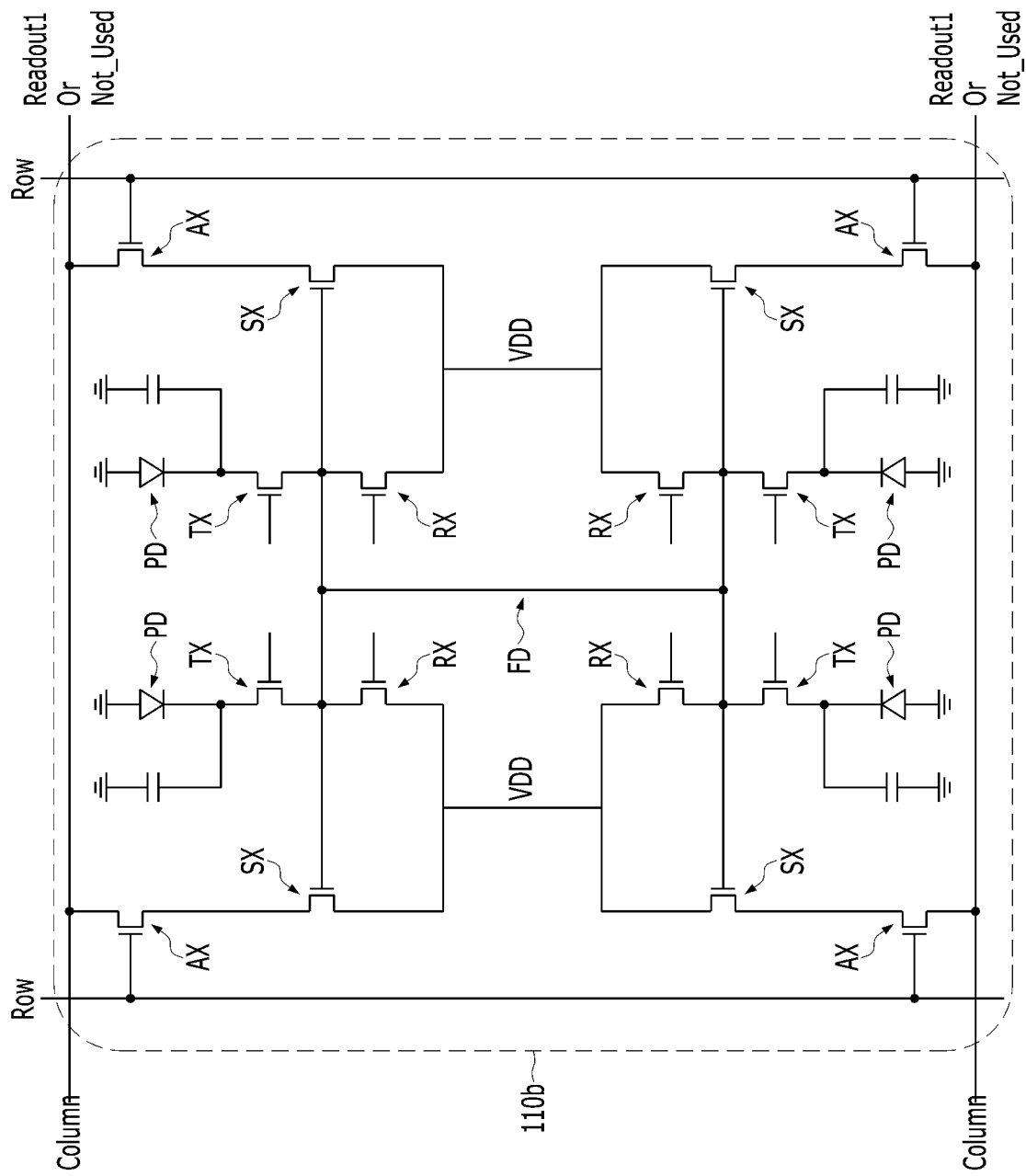
FIG. 9 illustrates a configuration of a pixel, such as that illustrated in FIG. 5.

FIG. 9 illustrates a configuration of the pixel described in FIG. 5. Specifically, FIG. 9 describes an example of the second pixel 110b disposed in the peripheral region of the pixel array included in the image sensor. Referring to FIG. 5, the second pixel 110b may include a plurality of photo diodes (PD), unlike the first pixel 120 including a single photo diode (PD).

Referring to FIG. 9, a plurality of second pixels 110b in the pixel array may be arranged in rows and columns. The second pixel 110 may be coupled to two row lines activated in response to two row addresses and two column lines for transferring pixel information to the signal output circuitry 130. Referring to FIGS. 6 and 7, pixel information may be outputted through one of two column lines Readout1, but no pixel information may be outputted through the other column line Not_Used. For example, the other column line Not_Used may be substantially disconnected to the second pixel 110 when some of selection transistor Sx or access transistor Ax do not work.

Referring to FIG. 9, four adjacent pixels, each corresponding to the first pixel 120, may be combined to form a single second pixel 110b. Each of the four adjacent pixels may have the same structure as described in FIG. 8. The floating diffusion regions FD, which are drains of the four transfer transistors Tx, are connected to each other, so that amounts of charge generated in response to the incident light by the photo diodes PD may be collected, or gathered, in the floating diffusion region FD.

According to an embodiment, the floating diffusion region FD in the second pixel 110b may be coupled to selection gates of four selection transistors Sx, but one among the four selection transistors Sx may work normally. The three remaining selection transistors (Sx) might not be operable. Through this scheme, pixel information corresponding to a sum of the amounts of charge generated by the plurality of photo diodes PD included in the second pixel 110b may be outputted through one of the column lines.

Although an embodiment in which the plurality of photo diodes may be coupled through the floating diffusion region FD is described in FIG. 9, a node between the selection transistor Sx and the access transistor Ax may be connected according to another embodiment. In this case, only one of the four access transistors Ax may operate normally, and the other three access transistors may not operate.

According to an embodiment, the second pixel 110b may include a plurality of photo diodes PD, but the second pixel 110b may output merged or combined pixel information. When outputting a single pixel signal, the second pixel 110b may sum amounts of charge generated by the plurality of photo diodes PD through various structures. Or, the second pixel 110b may have circuitry configured to sum pixel information or voltages corresponding to the amounts of charge generated by the plurality of photo diodes PD, so as to output the single pixel signal as pixel information.

Figure 10:
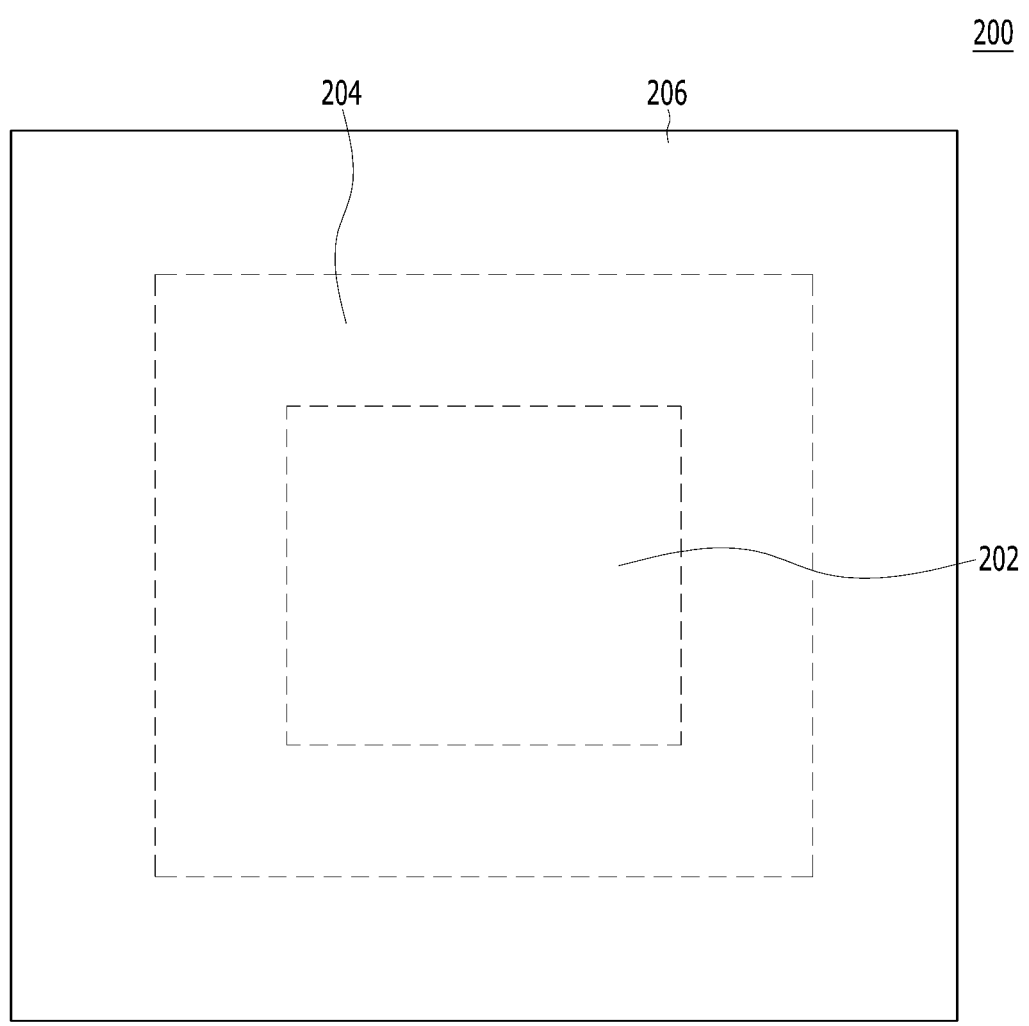
FIG. 10 illustrates an image sensor according to another embodiment of the disclosure.

FIG. 10 illustrates an image sensor according to another embodiment of the disclosure.

Referring to FIG. 10, the pixel array in the image sensor 200 may include three regions: a central region 202, a peripheral region 204, and an edge region 206, each region including pixels having different sizes.

Each of the three regions includes plural pixels. The central region 202 may include a plurality of first pixels having a first size, the peripheral region 204 may include a plurality of second pixels having a second size, and the edge region 206 may include a plurality of third pixels having a third size. The first size may be smaller than the second size, and the second size may be smaller than the third size. According to an embodiment, the size of a second pixel may be four approximately times the size of a first pixel, and the size of a third pixel may be four times the size of a second pixel. When the central region 202, the peripheral region 204 and the edge region 206 are each populated with different sized pixels as described above, the image sensor 200 may generate a monochrome or polychrome image having a different size corresponding to one of three regions or a different resolution corresponding to the sizes of pixels, according to a shooting mode of the camera device. An image outputted by the image sensor 200 collecting various types of pixel information may provide for more processing options by the camera device.

Although not shown, the image sensor 200 may include an additional signal processing unit such as the signal output circuitry 130 described in FIG. 7. In response to an operation mode, the signal processing unit may output one of first pixel information corresponding to the first size, third pixel information corresponding to the second size and the fifth pixel information corresponding to the third size, regarding the plurality of first pixels in the central region 202. Further, in response to the operation mode, the signal processing unit may output one of second pixel information corresponding to the second size and fourth pixel information corresponding to the third size, regarding the plurality of second pixels in the peripheral region 204.

For example, in a first operation mode among the operation modes, the signal processing unit may output the fifth pixel information obtained from the plurality of first pixels in the central region 202, the fourth pixel information obtained from the plurality of second pixels in the peripheral region 204, and sixth pixel information corresponding to a third size obtained from the plurality of third pixels in the edge region 206. Further, in a second operation mode among the operation modes, the signal processing unit may output the third pixel information, obtained from the plurality of first pixels in the central region 202, and the second pixel information obtained from the plurality of second pixels in the peripheral area 204. In the second operation mode, the signal processing unit might not output pixel information obtained from the plurality of third pixels included in the edge region 206. Further, in a third operation mode, the signal processing unit may output the first pixel information, obtained from the plurality of first pixels in the central region 202. In the third operation mode, the signal processing unit might not output the pixel information obtained from the plurality of second pixels in the peripheral area 204 and the plurality of third pixels included in the edge region 206. Herein, the first, second and third operation mode may be considered a central mode, an intermediate mode and a full mode of the image sensor. The central mode, the intermediate mode and the full mode can show a size of image with different resolutions based on a region of the pixel array, which is utilized for processing the image.

Referring to FIG. 10, the peripheral region 204 surrounds the central region 202, and the edge region 206 surrounds the peripheral region 204. When a user of the camera device wants to acquire a clearer image for a specific area in a scene, it is common to place the center of the camera lens in the corresponding area. Because the pixels disposed in the central region 202 has a smaller size than other pixels included in other regions, e.g., the peripheral region 204 and the edge area 206 of the pixel array included in the image sensor 200, the camera device including the image sensor 200 may be used easily by the user who would like to obtain a clearer image for the specific area. According to an embodiment, a region having pixels having the smallest size in the image sensor 200 may be disposed outside the center. For example, the region having the pixels having the smallest size may be set in a corner, depending on a purpose of usage or design specification regarding the camera device. Further, in the image sensor, there are a plurality of regions, each separated each other and each including pixels having the smallest size.

According an embodiment of the disclosure, an image sensor can change an area for gathering or collecting an image in a pixel array, or an operation mode in the area of the pixel array. The image sensor differently operating according to a shooting mode of camera can provide image data or pixel information appropriate for user's demands. The image sensor may provide the image data or the pixel information corresponding to the shooting mode, to lighten operational burden of image processing which a camera device equipped with the image sensor could perform using a specific algorithm. Further, the camera device equipped with the image sensor may have an advantage of providing an image that is closer to reality than that of providing a desired image.

In addition, according to an embodiment of disclosure, an image sensor can generate different information corresponding to a shooting mode of the camera device, so that the camera device may have an advantage of reducing a time for image processing in plural shooting modes based on the information generated from the image sensor, and thus increasing user's satisfaction regarding the camera device.

While the present invention has been illustrated and described with respect to specific embodiments, it will be apparent to those skilled in the art in light of the present disclosure that various changes and modifications may be made without departing from the spirit and scope of the disclosure as defined in the following claims. The present invention encompasses all changes and modifications that fall within the scope of the claims.

What is claimed is:

1. An image sensor comprising a pixel array including a central region in which plural first pixels output first pixel information and a peripheral region in which plural second pixels output second pixel information, the peripheral region surrounding the central region,
wherein a size of a second pixel, of the plural second pixels, is 4n times greater than that of a first pixel, of the plural first pixels, n being an integer,
wherein the first pixel information is transferred via a single column line coupling the first pixel of the pixel array to signal output circuitry, and the second pixel information is transferred via one of plural column lines each coupling the second pixel of the pixel array to the signal output circuitry.

2. The image sensor according to claim 1, wherein the first pixel comprises a single photodiode and a single lens over the single photodiode, and the second pixel comprises plural photodiodes and a single lens over the plural photodiodes.

3. The image sensor according to claim 1, wherein the second pixel comprises:
plural transfer gates, each configured to couple a respective one of the plural photodiodes to a floating diffusion area;
plural reset gates configured to reset the floating diffusion area; and
plural select gates, each configured to be turned on in response to an amount of charge accumulated in the floating diffusion area,
wherein only one of the plural select gates is turned on.

4. The image sensor according to claim 1, wherein each of the first pixel and the second pixel individually comprise a single photodiode and a single lens over the single photodiode.

5. An image sensor, comprising:
a pixel array including a central region in which plural first pixels each output first pixel information and a peripheral region in which plural second pixels each output second pixel information, the peripheral region surrounding the central region; and
signal output circuitry configured to combine first pixel information, individually outputted from each pixel in a set of adjacent pixels, among the plural first pixels, to generate third pixel information for output in a first operation mode,
wherein the first pixel information is transferred via a single column line coupling the first pixel of the pixel array to signal output circuitry, and the second pixel information is transferred via one of plural column lines each coupling the second pixel of the pixel array to the signal output circuitry.

6. The image sensor according to claim 5,
wherein the signal output circuitry is configured to output the first pixel information outputted from the plural first pixels of the central region in a second operation mode which is distinguishable from the first operation mode, and
wherein the signal output circuitry is configured to screen the second pixel information outputted from the plural second pixels of the peripheral region in the second operation mode.

7. The image sensor according to claim 5, wherein the number of pixels in the set of adjacent pixels which output first pixel information that is combined by the signal output circuitry is determined based on a ratio of a flat size of the first pixel to a flat size of the second pixel.

8. The image sensor according to claim 7, wherein the flat size of the first pixel is ¼n times of the flat size of the second pixel, where n is an integer of 1 or greater.

9. The image sensor according to claim 7, wherein the signal output circuitry is configured to:
receive an operation mode signal and a row address of the pixel array; and
determine, based on the operation mode signal and the row address, which of the first and second pixels pixel information is transferred via a column line when the column line crosses the first and second regions.

10. An image sensor, comprising:

a pixel array including a first region including plural first pixels, each having a first planar area, and a second region including plural second pixels, each having a second planar area; and signal output circuitry configured, based on an operation mode, to output either first pixel information outputted from each of the plural first pixels or third pixel information obtained and combined from the plural first pixels, wherein the first pixel information corresponds to a size of the first planar area and the third pixel information corresponds to a size of the second planar area, and wherein the first pixel information is transferred via a single column line coupling the first pixel of the pixel array to the signal output circuitry, and second pixel information is transferred via one of plural column lines each coupling the second pixel of the pixel array to the signal output circuitry.

11. The image sensor according to claim 10, wherein the signal output circuitry is configured, in a first operation mode, to output the third pixel information, and wherein the signal output circuitry is configured, in the first operation mode, to output second pixel information obtained from the plural second pixels in the second region.

12. The image sensor according to claim 11, wherein the signal output circuitry is configured, in a second operation mode, to output the first pixel information, and wherein the signal output circuitry is configured, in the second operation mode, to screen the second pixel information.

13. The image sensor according to claim 10, wherein the pixel array further comprises a third region including plural third pixels, each having a third planar area, wherein the signal output circuitry is configured, based on the operation mode, to output one among the first pixel information, the third pixel information and fifth pixel information obtained from the plural first pixels, wherein the signal output circuitry is configured to generate the fifth pixel information by combining some of the first pixel information, wherein the fifth pixel information corresponds to the third planar area, wherein the signal output circuitry is further configured, based on the operation mode, to output either second pixel information outputted from each of the plural second pixels and fourth pixel information respectively obtained and combined from the plural second pixels, and wherein the fourth pixel information corresponds to a size of the third planar area.

14. The image sensor according to claim 13, wherein the third planar area is larger than the second planar area, and the second planar area is larger than the first planar area.

15. The image sensor according to claim 13, wherein the signal output circuitry is configured, in a first operation mode, to output the fifth pixel information and the fourth pixel information, and wherein the signal output circuitry is configured, in the first operation mode, to output sixth pixel information obtained from the plural third pixels in the third region.

16. The image sensor according to claim 13, wherein the signal output circuitry is configured, in a second operation mode, to output the third pixel information and the second pixel information, and wherein the signal output circuitry is configured, in the second operation mode, to screen sixth pixel information obtained from the plural third pixels in the third region.

17. The image sensor according to claim 13, wherein the signal output circuitry is configured, in a third operation mode, to output the first pixel information, and wherein the signal output circuitry is configured, in the third operation mode, to output to screen both the second pixel information and sixth pixel information obtained from the plural third pixels in the third region.

18. The image sensor according to claim 10, wherein the signal output circuitry is configured to:

receive an operation mode signal and a row address of the pixel array, determine, based on the operation mode signal and the row address, which of the first to third pixels pixel information is transferred via a column line when the column line crosses the first to third regions, and determine, based on the operation mode signal and the row address, which of the second and third pixels pixel information is transferred via another column line when the another column line crosses the second and third regions.

* * * * *